United States Patent [19]

Espinoza

[11] Patent Number: 4,549,602
[45] Date of Patent: Oct. 29, 1985

[54] RACK ASSEMBLY FOR PLUG-IN MODULES

[75] Inventor: H. Cesar Espinoza, Buena Park, Calif.

[73] Assignee: Hollingsead International, Inc., Santa Fe Springs, Calif.

[21] Appl. No.: 479,327

[22] Filed: Mar. 28, 1983

[51] Int. Cl.[4] .............................................. F28F 7/00
[52] U.S. Cl. ..................... 165/80.2; 62/295; 165/67; 165/69; 361/383
[58] Field of Search ............... 211/26; 248/632, 634, 248/635; 165/67, 69, 80; 62/295; 361/383, 426

[56] References Cited

U.S. PATENT DOCUMENTS

| | | | |
|---|---|---|---|
| 1,388,967 | 8/1921 | Noble | 248/631 |
| 1,664,040 | 3/1928 | Masury et al. | 180/291 |
| 1,815,441 | 7/1931 | Masury et al. | 180/57 |
| 1,834,907 | 12/1931 | Trott | 248/638 |
| 1,883,893 | 10/1932 | Flaherty | 228/3.1 |
| 1,892,666 | 1/1933 | Gurney | 296/178 |
| 2,020,092 | 11/1935 | Allen | 248/26 |
| 2,412,838 | 12/1946 | Shores | 248/22 |
| 2,448,281 | 8/1948 | Saurer | 248/9 |
| 3,079,132 | 2/1963 | Tiegel | 165/69 X |
| 3,193,236 | 7/1965 | Thorn | 248/632 |
| 3,771,023 | 11/1973 | Hollingsead et al. | 361/383 |
| 3,826,456 | 7/1974 | Tranter et al. | 248/375 |
| 3,917,201 | 11/1975 | Roll | 248/20 |
| 3,970,272 | 7/1976 | Kaesgen | 248/9 |
| 4,044,515 | 8/1977 | Hollingsead et al. | 361/383 X |
| 4,089,040 | 5/1978 | Paulsen | 361/383 |
| 4,153,225 | 5/1979 | Paulsen | 244/118 R |
| 4,306,615 | 12/1981 | Bolton | 165/69 X |
| 4,306,708 | 12/1981 | Gassaway | 248/635 |
| 4,326,693 | 4/1982 | Noble | 248/635 |
| 4,458,296 | 7/1984 | Bryant et al. | 361/426 X |

FOREIGN PATENT DOCUMENTS

| | | | |
|---|---|---|---|
| 533059 | 2/1941 | United Kingdom | 248/635 |
| 2027181A | 2/1980 | United Kingdom | 62/295 |

OTHER PUBLICATIONS

Section B entitled "Design Concepts" of a catalog entitled Application Selection Guide from Barry Controls, Vibration, Shock and Noise, No. C5-178, copyrighted by Barry Wright Corp., 1978.

Primary Examiner—Sheldon J. Richter
Assistant Examiner—Randolph A. Smith
Attorney, Agent, or Firm—Jackson & Jones

[57] ABSTRACT

A rack assembly for mounting one or more plug-in type electronic/electrical modules in an aircraft or the like. The assembly provides mechanical isolation to the modules by way of at least two resilient strips positioned on opposite sides of the shelf on which the modules are mounted. The assembly further includes an air plenum disposed adjacent the underside of the shelf for providing cooling air to the modules. The mechanism for providing mechanical isolation performs the additional function of forming part of the plenum. This dual function feature minimizes the amount of space consumed by the disclosed rack assembly.

15 Claims, 9 Drawing Figures

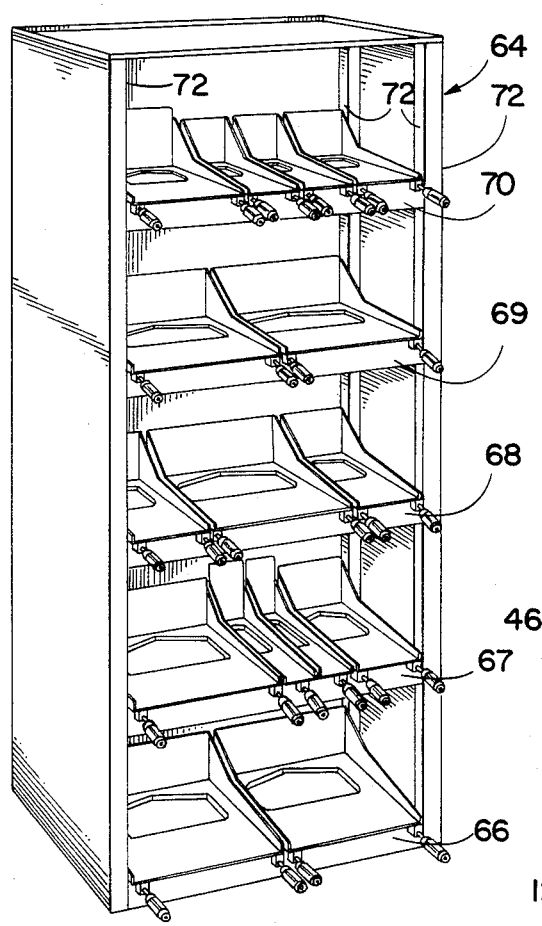
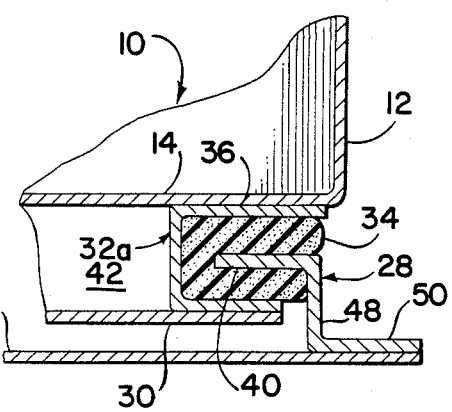
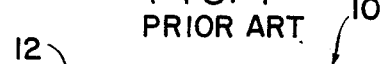
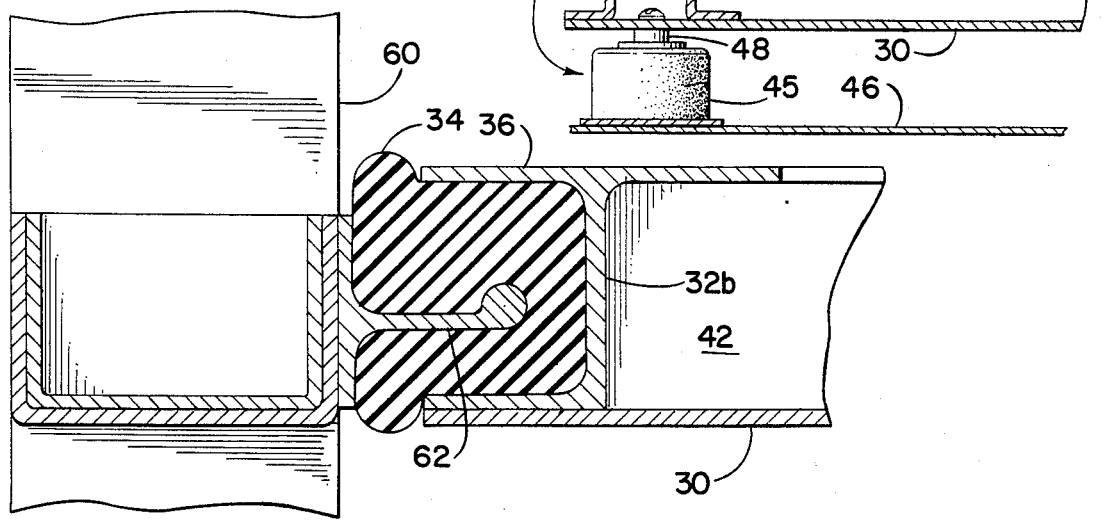

RACK ASSEMBLY FOR PLUG-IN MODULES

BACKGROUND OF THE INVENTION

1. Field of the Invention

The present invention relates to the field of racking apparatus for supporting equipment and, more particularly, to a rack assembly for plug-in type modules which provides cooling air and mechanical isolation to the modules.

2. Background Art

Electronic equipment carried on vehicles such as ships and aircraft is frequently supported on rack assemblies which also provide cooling air and mechanical isolation from vibration and shock. Such equipment is typically in the form of plug-in modules which provide ready access for servicing and testing. The modules are generally installed in trays which are provided with one or more electrical connectors for mating with the complementary connectors mounted at the modules. In most applications, a plurality of trays are disposed adjacent one another on a common shelf. Frequently, the rack assembly includes two or more shelves positioned vertically with respect to one another.

U.S. Pat. No. 3,771,023 shows a typical tray for receiving a module. The bottom of each tray is provided with a metering plate which permits cooling air to enter the module. An air plenum is disposed below the metering plate for supplying cooling air to each of the trays on the shelf. If the rack assembly has more than one shelf, the plenums for each of the respective shelves are coupled together by a vertical channel sometimes referred to as a "transfer".

In most applications, it is necessary to isolate the electronic modules from shock and vibration. This is especially true of aviation electronic ("avionic") equipment. Heretofore, such isolation was provided for by point-type mechanical isolators disposed at each corner of the unit to be protected. The entire rack assembly can be isolated in this manner, or the individual shelves or trays. It is sometimes preferable to isolate the individual shelves or trays in order to prevent vibration generated by a piece of equipment mounted on one shelf or tray from being transferred to an adjacent shelf or tray.

Point-type isolators are disadvantageous in that they typically require a large amount of space. In avionic applications where space is at a premium, there is frequently not enough clearance to accomodate such isolators. This problem is especially pronounced if the shelves of the rack assembly are to be separately isolated. In addition point-type isolators typically provide for a relatively large amount of displacement of the isolated unit under vibration or shock thereby consuming additional space.

There are prior art mechanical isolators which differ from the previously-described point-type isolators which are used in other applications. Such isolators are disclosed in U.S. Pat. Nos. 3,970,272 and 2,020,092 for motor mounting applications. Although the isolators disclosed in these patents are more compact than the point-type isolators, these patents do not suggest any means for successfully incorporating the isolators in rack assembly for avionic equipment and the like.

The rack assembly disclosed herein overcomes the previously-described shortcomings of the prior art apparatus. The subject assembly provides for mechanical isolation of the individual shelves or trays and is suitable in applications where space is at a premium despite the presence of cooling air plenums. These and other advantages of the disclosed rack assembly will be apparent to one of ordinary skill in the art upon reading the following detailed description of the invention together with the drawings.

SUMMARY OF THE INVENTION

A rack assembly for mounting one or more plug-in type electronic/eletrical modules, such as avionic equipment, is disclosed. The rack assembly provides mechanical isolation to the modules thereby protecting the modules from vibration and shock. The assembly further provides cooling air to the modules by way of an air plenum disposed adjacent the module support shelf of the assembly.

Mechanical isolation is achieved by way of elongated resilient members which are fabricated from rubber or the like. The elongated resilient members are positioned on at least two opposite sides of the module support shelf. Each resilient member is disposed between a pair of beams, with one of the beams being connected to the support shelf and the other beam being connected to a structural support such as aircraft avionic bay bulkhead.

The air plenum is formed, in part, by a lower panel which is spaced apart from the module support shelf. In addition, part of the apparatus which accomplishes the mechanical isolation function also serves to form part of the air plenum.

BRIEF DESCRIPTION OF THE DRAWINGS

FIG. 1 is a sectional view of part of a rack assembly employing a prior art point-type mechanical isolator.

FIG. 6 is a partial cross-sectional view of one embodiment of the mechanical isolator of a rack assembly embodying the subject invention.

FIG. 7 is a partial cross-sectional view of an alternative embodiment of the mechanical isolator of a rack assembly embodying the subject invention.

FIG. 8 is a perspective view of an exemplary rack assembly embodying the subject invention.

DETAILED DESCRIPTION OF THE INVENTION

Figure 2:
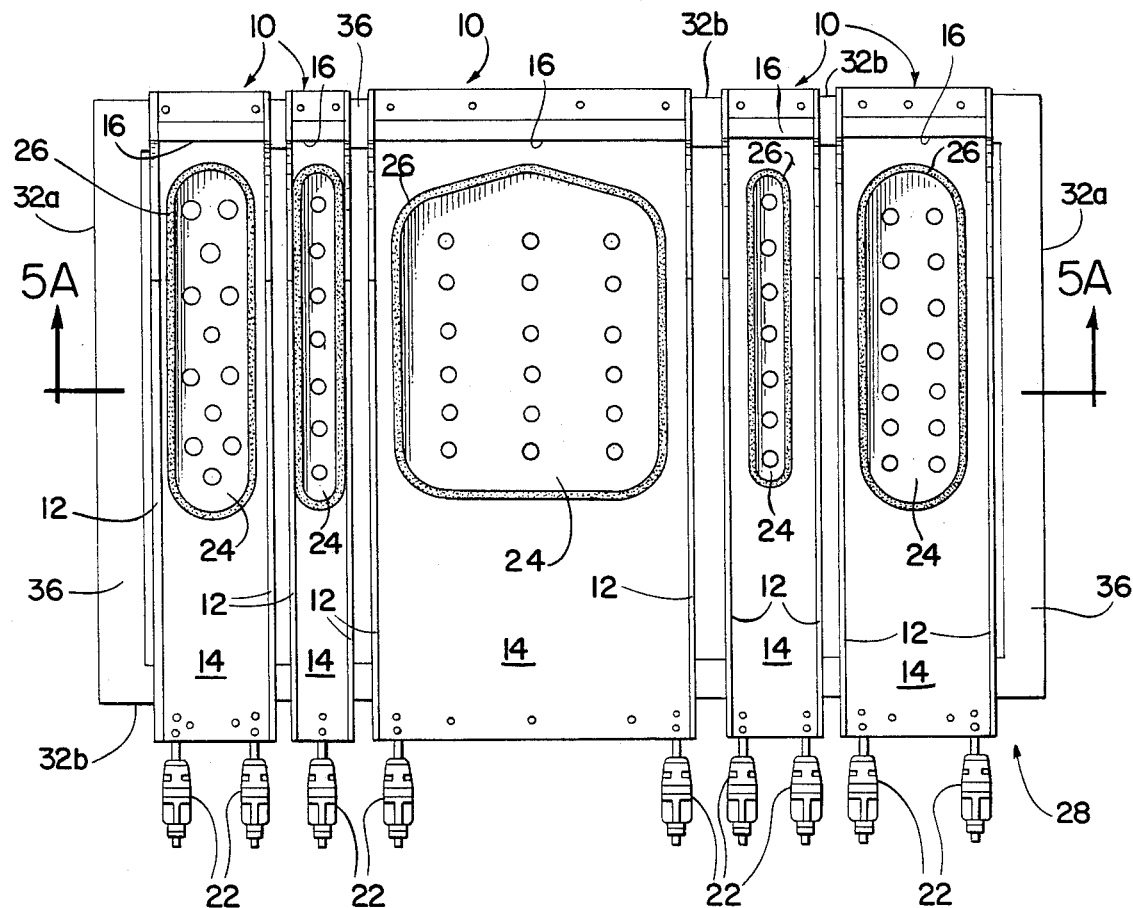
FIG. 2 is a plan view of a rack assembly embodying the subject invention.
Figure 3:
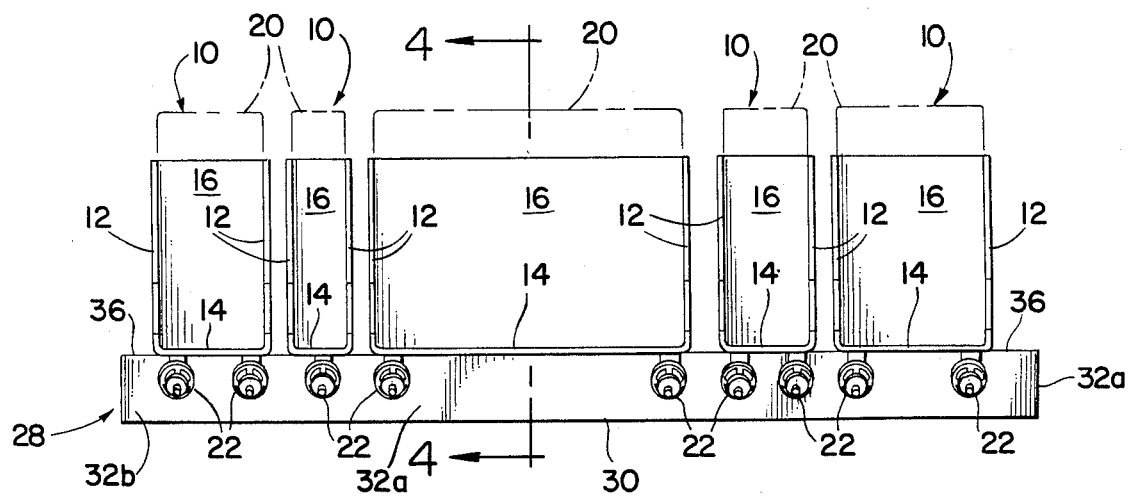
FIG. 3 is a front elevational view of the rack assembly of FIG. 2.

Referring now to the drawings, an exemplary embodiment of the subject rack assembly may be seen in FIGS. 2 through 5A. Unless indicated otherwise, the principle components of the disclosed rack assembly are fabricated from aluminum alloy. The exemplary assembly, generally designated by the numeral 28, is comprised of a single shelf having five individual trays 10. It is to be understood that additional shelves can be included and that fewer or additional trays per shelf may be used. For example, FIG. 8 shows another exemplary rack assembly, generally designated by the numeral 64, having five shelves 66-70. The shelves are supported by four vertical beams 72 of the assembly. The bottom shelf 66 is provided with two relatively wide trays, the next higher shelf 67 with four trays and so on. Each shelf is provided with a cooling air plenum (not shown) disposed beneath the trays. The plenums of each of the shelves are coupled together by vertical transfers (not shown) thereby enabling each shelf to be provided with cooling air from a common source.

Trays 10 usually are of standard widths with the narrower trays being referred to in the industry as ¼ ATR, the intermediate width trays as ½ ATR and the wider trays as 1 ATR. Other sizes are also used. As can best be seen in FIGS. 4 and 5A, each tray is provided with a pair of vertical side rails 12 which extend approximately the full length of the tray. The trays 10 each further include a bottom panel 14 and a back panel 16. Back panels 16 carry one or more electrical connector halves (not shown) for mating with the corresponding connector halves mounted on the rear of the electrical modules, such modules being shown in phantom and designated by the numeral 20.

Each of the trays 10 is provided with at least one extractor/hold down device 22. Devices 22, which engage a hook (not shown) mounted on the front panel of the plug-in modules, are used for inserting the modules in the tray and securing the modules in place. The devices further extract the modules from the tray. The narrower ¼ ATR trays require only a single extractor/hold down device 22, whereas the wider trays ½ and 1 ATR trays utilize two.

Each tray 10 is further provided with an air metering plate 24 disposed in the center of bottom plate 14. The metering plate is secured within a recessed opening in bottom plate 14 by a rubber gasket 26. As can best be seen in FIGS. 4 and 5A, gaskets 26 extend above the bottom plate 24 of the trays so as to sealably engage the underside of the electronic modules 20. The modules are provided with air cooling openings (not shown) which are disposed over the metering plates 24. The plates themselves are provided with several openings which control the amount of cooling air supplied to each module. The metering plates can be replaced with plates having varying air opening sizes, thereby permitting the amount of cooling air provided to each module to be controlled, as is needed.

Figure 4:
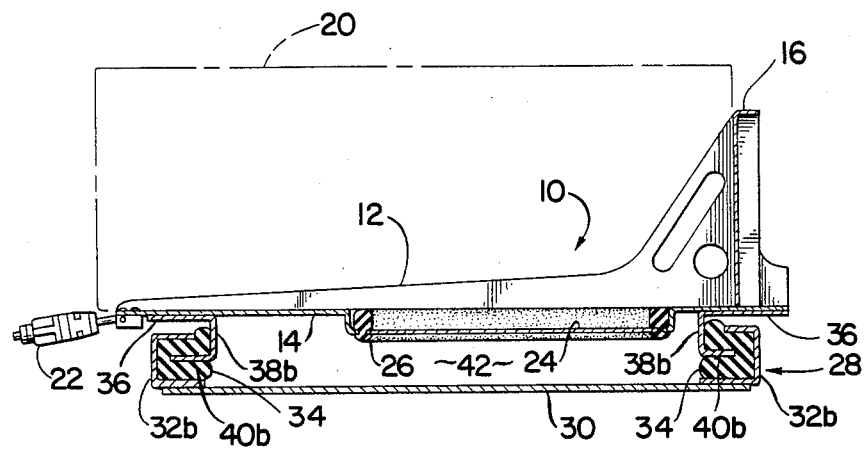
FIG. 4 is a cross-sectional view of a rack assembly taken through section line 4—4 of FIG. 3.
Figure 5A:
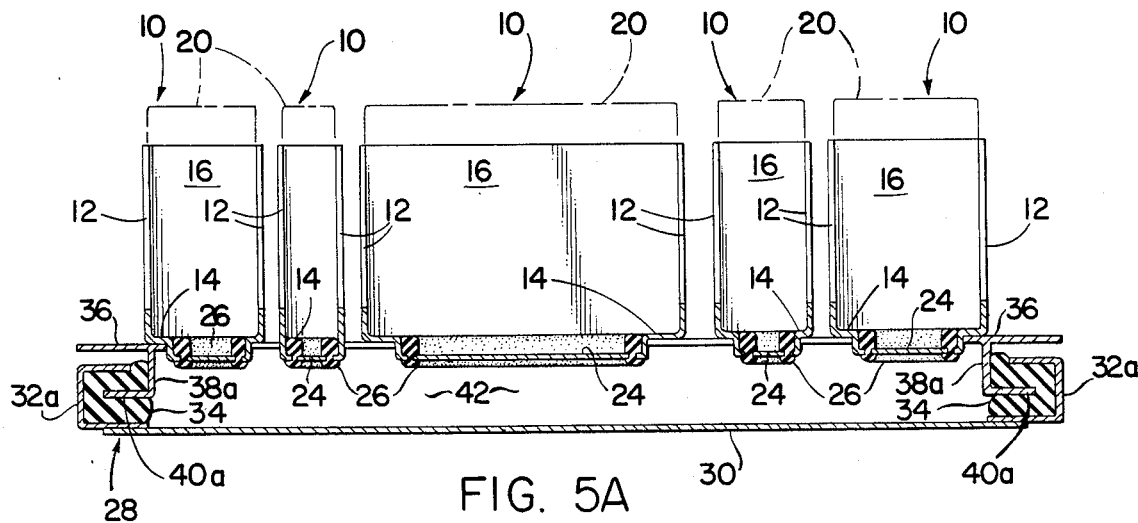
FIG. 5A is a cross-sectional view of a rack assembly taken through section line 5A—5A of FIG. 2.

The trays 10 are mounted on a common support shelf of the rack assembly. In addition to providing support for the trays, assembly 28 provides mechanical isolation and cooling air to the modules FIGS. 4 and 5A show further details of the exemplary rack assembly 28. The assembly includes a rectangular bottom panel 30 which generally extends across the underside of the assembly. The assembly further includes a pair of side beams 32a, as shown in FIG. 5A, and front and rear beams 32b as shown in FIG. 4. The front, rear and side beams, collectively referred to as beams 32, are secured together at their respective ends to form a rigid rectangular structure. In typical applications, assembly 28 of FIGS. 4 and 5A is supported by either side beams 32a or bottom panel 30 which are affixed to structural members of the vehicle. It also is possible to support the assembly by way of the front and rear beams 32b either alone or in combination with other elements.

Beams 32 are each comprised of upper and lower horizontal flanges connected together by a vertical wall. The bottom flange is secured to the upper surface of the bottom panel 30 by welding, riveting and the like. Whatever securing means is used, it is imperative that the junction between the bottom panel 30 and beams 32 be airtight.

The upper and lower horizontal flanges of beams 32 together with the vertical wall form a generally C-shaped cross-section. Elongated resilient members 34 are positioned within the recesses formed by the beams. Members 34 are preferably fabricated from an elastomer such as rubber or other similar materials known to persons skilled in the art of mechanical isolator design. In order to facilitate assembly, members 34 are manufactured in four separate sections with each section preferably extending substantially along the full length of the beam.

Assembly 28 further includes four horizontal flanges 36 for supporting the trays which extend around the periphery of the assembly. Horizontal flanges 36 at the sides of the assembly are supported by vertical walls 38a as shown in FIG. 5A which extend along the full length of the top flange. Similarly, flanges 36 at the front and rear of the assembly are supported by vertical walls 38b as shown in FIG. 4. Walls 38b are, in turn, supported by horizontal flanges 40b which are received by horizontal longitudinal slots formed in the associated resilient members 34. As can be seen in FIG. 5A, vertical walls 38a are supported by horizontal flanges 40a which are also received by longitudinal slots formed in the associated resilient members 34.

The respective ends of flanges 36 are fastened together to form a rigid and generally rectangular support surface which defines a relatively large rectangular central opening. As can best be seen in FIGS. 2 and 4, trays 10 are positioned over the rectangular opening with the front and rear portions of each of the trays being secured to the front and rear flanges 36, respectively. Elongated spacers (not shown) are also positioned over flange 36 adjacent the side rails 12 of the trays for the purpose of preventing the escape of cooling air. In the event a tray position on the assembly is not used, a cover plate is secured over the empty space to block the passage of cooling air.

As can best be seen in FIGS. 4 and 5A, an air plenum 42 is formed by bottom panel 30, trays 10 and front and rear elongated resilient members 34 together with vertical walls 38a and 38b. Thus, when cooling air is introduced into plenum 42 by a cooling air source (not shown), the air passes through the respective metering plates 24 of each of the trays through the air cooling openings (not shown) on the bottom side of the electronic modules 20 and out module cooling openings (not shown) typically located on the top or front panel of the modules. Alternatively, the direction of cooling air flow can be reversed by introducing a vacuum in plenum 42 using a suction fan. In that event the cooling air travels through the modules into the metering plates and out the plenum.

The rack assembly 28 of FIGS. 4 and 5A may be secured to a structural support of the vehicle in various ways. For example, bottom panel 30 may be secured to a horizontal member of the vehicle such as a floor panel at an avionics bay of an aircraft. The bottom panel 30 may also be suspended between the vertical beams of the rack assembly itself such as vertical beams 72 (FIG. 8). Alternatively, the assembly may be inverted and suspended from an upper structural support such as a ceiling panel of an avionics bay. In addition, the assembly may be secured to a structural support by way of beams 32.

In addition to performing the function of forming part of air plenum 42, resilient members 34, flanges 38a and 38b together with beams 32 and associated hardware perform the function of mechanically isolating modules 20 from the structural support of the vehicle. Isolation from vibration and shock present in the vehicle is provided in all axes of motion.

The apparatus for providing mechanical isolation in the disclosed rack assembly, which also performs the function of forming part of the air plenum, consumes very little space. For purposes of comparison, FIG. 1 shows a prior art point-type mechanical isolator unit generally designated by numeral 44. The isolator unit typically includes a base 45 and a mounting shaft 48 mechanically isolated from the base. Four isolators are required to support either a single tray 10 or a single shelf having plurality of trays, with one isolator being positioned at each corner. The isolator shown in FIG. 1 is positioned beneath a forward corner of a tray 10. The isolator is typically disposed below the tray between a structural support member 46, such as a structural beam of an aircraft, and the bottom panel 30 of the tray or shelf which forms the bottom of the air plenum 42. The principle disadvantage of the prior art approach is that the point-type isolators consume a large amount of space and are relatively heavy.

Figure 5B:
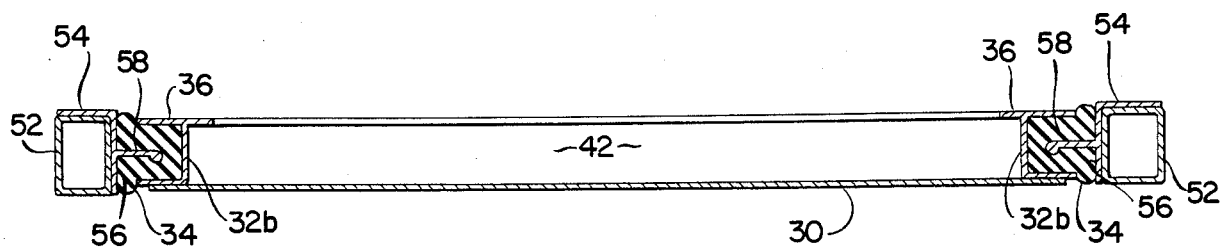
FIG. 5B is a partial cross-sectional view of a rack assembly which is an alternative to the assembly of FIG. 5A.

FIG. 5B shows a portion of an alternative rack assembly 28 where like numerals refer to like parts. This assembly is particularly suitable in applications where lateral support is to be used such as horizontal structural support members 52. Support members 52 may be part of the vehicle itself such as a bulkhead or may be part of the rack assembly. For example, members 52 may be horizontal beams suspended between vertical beams 72 of the rack assembly of FIG. 8.

The FIG. 5B assembly includes an elongated L-shaped mounting bracket comprised of horizontal flange 54 and transverse vertical flange 56. Flanges 54 and 56, which extend substantially the full length of the sides of the assembly, are rigidly secured to the horizontal structural support beams 52. An additional flange 58 extends horizontally from the central portion of the vertical flange 56, away from beam 52, generally along the full length of the vertical flange.

The assembly of FIG. 5B further includes side beams 32b, and possibly front and rear beams (not shown) collectively referred to as beams 32. Side beams 32b have a generally C-shaped cross-section formed by upper and lower horizontal flanges connected together by a vertical wall. Elongated resilient members 34 are retained within each of the side beams 32b and extend substantially along the full length of the beams. Resilient members 34 are provided with longitudinal slots for receiving horizontal flanges 58. In order to increase the strength of the apparatus the extreme ends of flanges 58 may have an expanded circular cross-section as shown. In that event, the dimensions of the slot formed in resilient members 34 are adjusted to accomodate this expanded cross-section.

In the event horizontal structural support beams adjacent the front and rear of the assembly are also available, the rack assembly of FIG. 5B may also include front and rear beams (not shown) similar in construction to side beams 32b. The front and rear beams would receive elongated resilient members similar to members 34 of the side beams. The front and rear structural support beams would each carry L-shaped brackets similar to the brackets of FIG. 5B. The L-shaped bracket would include horizontal flanges which are received by longitudinal slots formed in the resilient members. A bottom panel 30 is secured to the lower portion of beams 32 so as to form an air plenum 42.

The horizontal upper portions of the front, rear and side beams 32 of the FIG. 5B embodiment define a support surface for the trays (not shown). Thus, the trays are totally mechanically isolated from the structural support beams 52 in all axes of movement. In addition, beams 32 perform the further function of forming part of the air plenum.

FIG. 7 shows a portion of a rack assembly similar to that of FIG. 5B, which is adapted to be supported laterally by vertical support members 60. Support members 60 may be part of the structural support of the vehicle or a vertical support beam of the rack assembly itself, such as beams 72 shown in FIG. 8. A horizontal flange 62 is rigidly affixed to the vertical support 60 and extends generally from the front to the rear of the assembly. The assembly further includes side beams 32b and resilient members 34 similar in construction and function to the corresponding components of the FIG. 5B assembly. As with the FIG. 5B assembly, this assembly may also include front and rear beams.

Referring to FIG. 6, a portion of another alternative rack assembly 28 may be seen. Assembly 28 includes a rectangular-shaped bottom panel 30. Beams 32, including side beams 32a, extend above and around the periphery of the bottom panel. Side, front and rear beams 32a include upper and lower horizontal flanges connected together by a vertical wall. The top flanges 36 of beams 32 define a support surface for one or more trays 10. Bottom panel 30, together with beams 32, trays 12 and associated hardware form an air plenum 42.

An elongated resilient member 34 is disposed in each of the recesses formed by beams 32 of the FIG. 6 structure. Members 34, which preferably extend along substantially the full length of the beams, are provided with longitudinal slots for receiving a horizontal flange 40. Flange 40 is supported by a vertical wall 48 which is in turn supported by a second horizontal flange 50 extending in a direction opposite to that of flange 40. Lower flange 50 is secured to a support member 46, such as a floor panel of an aircraft avionics bay. Thus, modules mounted in trays 10 are mechanically isolated from the support member 46 in all axes of movement.

It is generally preferable that resilient members 34 extend around substantially the entire periphery of the support surface which carries the trays in order to distribute the loading over the largest possible area. By maximizing the area of loading, it is possible to use relatively thin resilient members 34 in comparison to the corresponding resilient members of the prior art point-type isolators and yet achieve the same degree of mechanical isolation. However, in some applications it is not possible or practical to extend the resilient members around the entire periphery of the support surface. For example, in some applications, gaps in the resilient members are required in order to provide access to the mechanically isolated components. Also, in some applications it is sufficient that only two opposite sides of the support surface be supported by the resilient members. For example, in the FIGS. 5B, 6 and 7 rack assemblies, it would be possible to suspend the two sides of the assembly in the resilient members and leave the front and back of the assembly floating. In any event, at least approximately forty percent (40%) of the periphery of the support surface should be suspended in the resilient members 34 in order to achieve sufficient mechanical isolation while maintaining the desired space-savings properties of the subject invention.

Should the front and rear resilient members of the FIGS. 5B, 6 and 7 rack assemblies be deleted, it is necessary to provide alternate means for enclosing the air plenum 42. By way of example, front and rear horizontal beams can be provided which extend between and are connected to the side beams. The lower portion of the horizontal beams would be connected to the bottom panel 30. In addition, it is preferable that the upper portion of the horizontal beams include a horizontal flange, similar to flange 36, for defining part of the support surface for the trays.

It would also be possible to suspend the front and rear of the rack assembly in the resilient members and leave the sides of the assembly floating. Again, the floating sides would have to be covered with suitable vertical panels in order to seal the air plenum.

The components of the FIGS. 5B, 6 and 7 rack assemblies which define the air plenum are rigidly secured together. In the event the side resilient elements or the front and rear resilient elements are deleted, the air plenum can be readily enclosed using horizontal beams as previously described. In contradistinction, the components which define the air plenum of the FIGS. 4 and 5A rack assemblies are not rigidly secured to one another. For example, upper flange 36 of the FIG. 4 assembly which defines the tray support surface does not move with the bottom panel 30 under vibration and shock. Accordingly, it is somewhat more difficult to enclose the plenum in the event one or more of the resilient elements 34 are deleted.

Thus, various embodiments of a novel rack assembly have been disclosed. While such embodiments have been described in detail it would be readily apparent to persons skilled in the art that numerous changes and modifications can be made thereto without departing from the spirit and scope of the invention as defined by the appended claims read in light of the present specification.

What is claimed is:

1. A rack assembly for receiving at least one plug-in module and for providing mechanical isolation for the module from a structural support and for further providing cooling air to the module, said assembly comprising:
   tray support means for defining a support surface for the module;
   a mechanical isolator including (i) first and second parallel elongated beams connected to opposite ends of said tray support means, (ii) third and fourth parallel elongated beams extending adjacent to and substantially the entire length of the first and second beams, respectively, the third and fourth beams being arranged to be secured to the structural support, and (iii) a resilient means for resiliently coupling said first and third and second and fourth beams together so that shocks and vibration imparted to the structural support must pass through the resilient means in order to reach the tray support means and module supported thereon and plenum means for forming an air plenum adjacent said support means, with said air plenum being formed in part by said mechanical isolator.

2. The rack assembly of claim 1 wherein said air plenum is formed, in part, by said first and second beams.

3. The rack assembly of claim 2 wherein said plenum means further comprises a panel spaced apart from said support means and connected to said first and second beams.

4. The rack assembly of claim 1 wherein said third and fourth beams define recesses for receiving said first and second beams, respectively and wherein said first and second beams are provided with flanges which extend into slots formed in said first and second resilient members, respectively.

5. The rack assembly of claim 1 wherein said mechanical isolator further comprises (i) fifth and sixth beams disposed on opposite sides of said support means, the fifth and sixth beams being disposed generally transverse to said first and second beams and (ii) seventh and eighth beams positioned adjacent said fifth and sixth beams, respectively, and wherein said resilient means further comprises a first elongated resilient member disposed between said first and third beams, a second elongated resilient member disposed between said second and fourth beams, a third elongated resilient member disposed between said fifth and seven beams and a fourth elongated resilient member disposed between said sixth and eighth beams.

6. The rack assembly of claim 5 wherein said air plenum is formed, in part, by said first, second, fifth and sixth beams.

7. The rack assembly of claim 6 wherein said plenum means further comprises a panel spaced apart from said tray support means and connected to said first, second, fifth and sixth beams.

8. The rack assembly of claim 5 wherein said air plenum is formed, in part, by said first, second, third and fourth elongated resilient members.

9. A rack and tray assembly for receiving a plurality of plug-in avionic modules and for providing mechanical isolation for the modules from a structural support and for further providing cooling air to the modules, said assembly comprising:
   a plurality of support trays having front and rear portions each tray defining a generally rectangular support surface for supporting one of the modules, and having a central opening therein arranged to be located under the module for the passage of cooling air circulated through the module;
   a mechanical isolator comprising (i) first front and rear elongated beams connected to the bottom of each of said trays at the front and rear portions thereof, respectively; (ii) second front and rear elongated beams secured to the structural support, the front beams being positioned adjacent each other and the rear beams being positioned adjacent each other; and (iii) a resilient means for resiliently coupling said front beams together and said rear beams together, so that shock and vibration imparted to the structural support must pass through and be attenuated by the resilient means in order to reach the support trays and any modules supported thereon to thereby protect the electronic modules from such shock and vibration, and
   plenum means for forming an air plenum under said support trays and in communication with the central openings therein, said plenum means comprising a panel spaced apart from said support trays and at least a portion of said mechanical isolator.

10. In a rack assembly for supporting a plurality of trays, each of which are arranged to receive and support a plug-in electronic module with respect to a structural support, the trays including a central opening therein for allowing cooling air to circulate through the modules, the combination which comprises:

- a first elongated beam defining a first support surface for receiving and supporting the underside of one end of each of the trays;
- a second elongated beam defining a second support surface for receiving and supporting the underside of the other end of each of the trays;
- a third elongated beam extending along substantially the entire length of the first beam and positioned adjacent thereto, the third beam being arranged to be secured to the structural support;
- a fourth elongated beam extending along substantially the entire length of the second beam and positioned adjacent thereto, the fourth beam being arranged to be secured to the structural support;
- resilient strip means disposed between the first and third beams and between the second and fourth beams, whereby there is no mehanical contact between the adjacent beams and all shock and vibration imparted to the structural support are dampened by the resilient strip means before reaching the trays and electronic modules, and
- plenum means for forming an air plenum under the trays including a panel spaced below the tray supporting surface and a portion of said first and second beams.

11. The combination as defined in claim 10 wherein the panel is connected to the first and second beams.

12. The combination as defined in claim 10 wherein the plenum means includes a portion of all four beams and the resilient means.

13. The combination as defined in claim 10 further including fifth, sixth, seventh and eighth elongated beams, the fifth and sixth beams being secured to each end of the first and second beams on each side thereof whereby said first, second, fifth and sixth beams form an open rectangle for supporting the trays, the seventh and eighth beams extending substantially the entire length of and positioned adjacent to the fifth and sixth beams, respectively, the seventh and eighth beams being secured to each end of the third and fourth beams, and additional resilient strip means positioned between the fifth and seventh and sixth and eighth beams to provide mechanical isolation between said beams.

14. The combination as defined in claim 10 wherein the first and third and second and fourth beams include overlapping flanges disposed substantially parallel to the support surface and wherein the resilient strip means includes at least one groove running the length thereof for receiving one of the flanges.

15. The combination as defined in claim 10 wherein each of said beams has a generally C-shaped cross-section and wherein the resilient means is made of rubber.

* * * * *